United States Patent
Enguent et al.

(10) Patent No.: US 7,307,472 B2
(45) Date of Patent: Dec. 11, 2007

(54) DIGITAL DEMODULATOR WITH A LOW SAMPLING FREQUENCY

(75) Inventors: Jean-Pierre Enguent, Saint Savournin (FR); Olivier Artigue, La Valette du Var (FR); Claude Tetelin, Sollies Pont (FR)

(73) Assignees: STMicroelectronics S.A., Montrouge (FR); Universite d'Aix Marseille I, Marseille Cedex (FR)

( * ) Notice: Subject to any disclaimer, the term of this patent is extended or adjusted under 35 U.S.C. 154(b) by 49 days.

(21) Appl. No.: 10/974,070

(22) Filed: Oct. 27, 2004

(65) Prior Publication Data

US 2005/0093682 A1 May 5, 2005

(30) Foreign Application Priority Data

Oct. 30, 2003 (FR) .................................. 03 50752

(51) Int. Cl.
*H03D 1/00* (2006.01)
(52) U.S. Cl. ..................... 329/347; 329/361; 375/353
(58) Field of Classification Search ................ 329/347, 329/361; 375/353
See application file for complete search history.

(56) References Cited

U.S. PATENT DOCUMENTS

| 4,757,467 | A | * | 7/1988 | Dieterich et al. | ........... 708/605 |
|---|---|---|---|---|---|
| 4,823,298 | A | * | 4/1989 | Wu et al. | .................. 708/446 |
| 4,827,515 | A | * | 5/1989 | Reich | ............................ 381/7 |
| 4,973,977 | A | | 11/1990 | Hawkins et al. | |
| 4,982,193 | A | * | 1/1991 | Saul | ........................... 341/159 |
| 5,157,343 | A | | 10/1992 | Voorman | |
| 5,767,780 | A | * | 6/1998 | Smith et al. | ................ 340/648 |
| 5,943,324 | A | * | 8/1999 | Ramesh et al. | ............ 370/321 |
| 6,285,316 | B1 | * | 9/2001 | Nir et al. | ............... 342/357.09 |
| 6,975,689 | B1 | * | 12/2005 | McDonald et al. | ......... 375/316 |

OTHER PUBLICATIONS

French Search Report from corresponding French Application No. 03/50752, filed Oct. 30, 2003.

* cited by examiner

*Primary Examiner*—Robert Pascal
*Assistant Examiner*—James Goodley
(74) *Attorney, Agent, or Firm*—Lisa K. Jorgenson; James H. Morris; Wolf, Greenfield & Sacks, P.C.

(57) ABSTRACT

An amplitude demodulation method and device comprising a converter sampling an input signal having its sampling frequency corresponding to three times the modulation carrier frequency.

1 Claim, 2 Drawing Sheets

Prior Art

US 7,307,472 B2

DIGITAL DEMODULATOR WITH A LOW SAMPLING FREQUENCY

BACKGROUND OF THE INVENTION

1. Field of the Invention

The present invention relates to the field of digital demodulators and to at least amplitude demodulators.

The present invention applies, for example, to electromagnetic transponder systems, be it on the terminal or on the transponder side. The present invention more specifically applies to transponders having no autonomous power supply (for example, contactless smart cards) and to autonomous terminals (battery-supplied), for example hand held terminals.

2. Discussion of the Relate Art

FIG. 1 very schematically shows in the form of blocks a conventional example of the architecture of a contactless smart card to which the present invention applies.

Such a smart card or transponder is intended to communicate with a read/write terminal (not shown) and draws the power necessary to the supply of the circuits that it comprises from a high-frequency field radiated by the terminal.

A transponder essentially comprises an oscillating circuit formed of an inductance L in parallel with a capacitor C in charge of sensing a high-frequency field (for example, at 13.56 MHz). A rectifying component 2, for example a fullwave rectifier, is connected to terminals 3 and 4 of the oscillating circuit and provides a D.C. voltage, filtered by a supply capacitor Cf, to application circuits 5 (IC) of the transponder. A linear regulator 6 may be interposed between the rectified output of bridge 2 and the power input terminal of circuits 5.

The transmission of information from a read/write terminal (not shown) to a transponder is performed by modulating, at the rate of a sub-carrier (for example, at 53 kHz) the remote-supply carrier (for example, at 13.56 MHz) according to the code of the message to be transmitted. This modulation is an amplitude modulation with a non-zero modulation index. On the transponder side, an amplitude demodulator 10 (AM DEMOD) is connected on one 3 of the terminals of the oscillating circuit upstream of the rectifying component and provides circuit 5 with the demodulated information.

The transmission of information from the transponder to the terminal is performed by means of a reverse modulation at the rate of a sub-carrier (847.5 kHz). This reverse modulation consists of modifying the transponder load on the electromagnetic field radiated by the terminal. For example, a series association of a resistor R and of a switch K controlled by circuit 5 is connected in parallel with oscillating circuit 1. Capacitive reverse modulation systems may also be found. On the terminal side, an amplitude and phase demodulator is provided to exploit the data transmitted by the transponder.

The present invention more specifically relates to the forming of the amplitude and possibly phase demodulator of an electromagnetic transponder or of a read/write terminal.

The analog-to-digital conversion of the transmitted information is performed either downstream of the demodulation which is then analog, or downstream of a digital decoding. The present invention more specifically relates to the case of a demodulation which requires a sampling of the signal extracted from the oscillating circuit before driving the demodulator. Generally, and for simplification, the sampling is then considered as belonging to the demodulator. By convention, the demodulator portion located downstream of the sampler, which provides the demodulated information, that is, the baseband (carrierless) digital data will be called the "digital demodulator".

FIG. 2 shows a conventional example of a demodulator providing, from an amplitude-modulated signal, two data I and Q enabling determining the amplitude and the phase of the sub-carrier signal, for example, in a QAM demodulation.

The received signal (for example, sampled from terminal 3 of the transponder) is submitted to an analog-to-digital conversion or sampling (block 11, CAN) with a sampling frequency fs before driving a digital demodulator 12 (DAM DEMOD). The samples provided at the output of demodulator 12 are on the one hand submitted to a multiplication by $\cos(\omega t)$, where $\omega$ represents the pulse of the sub-carrier and t represents time, before crossing a low-pass filter 14 (LPF) to provide information I, and on the other hand multiplied (multiplier 15) by $\sin(\omega t)$ before crossing a second low-pass filter 16 (LPF) providing information Q.

FIG. 3 illustrates what information I and Q amount to on a trigonometric circle of radius A, where A designates the amplitude of the sub-carrier signal. Knowing I and Q, the values of amplitude A and of phase $\phi$ are determined by applying the following relations:

$$A = \sqrt{I^2 + Q^2}; \text{ and}$$

$$\phi = \text{Arctan}(Q/I).$$

For the demodulator of FIG. 2 to be operative, sampling frequency fs must in practice be four times greater than the frequency of the carrier conveying the data. Theoretically (Shannon theorem), the sampling frequency could be equal to four times the carrier frequency, provided that the signal to be demodulated is in phase with the carrier, which is in practice very seldom the case. In particular, for electromagnetic transponders, a phase shift necessarily appears due to the distance variation between the transponder and the terminal so that this condition cannot be fulfilled. Conventionally, a sampling frequency greater than four times the carrier frequency is used to be sure to obtain information I and Q in reliable fashion for any sample.

In the example of electromagnetic transponders where the carrier frequency is 13.56 MHz, this requires a sampling frequency greater than 54.24 MHz. Now, the higher the sampling frequency, the greater the power consumption of the circuit implementing the conversion. Further, since the power consumption is proportional to the square of the supply voltage, this requires using high quality technology to avoid worsening power consumption performance, which results in an expensive technology.

The same problem occurs in a read and/or write terminal, the power consumption of which is desired to be minimized, especially if it is autonomous.

Currently, one solution to decrease the sampling frequency consists of performing an analog demodulation, then converting the demodulated signals to digital. This however poses many problems, especially for the impedance matching and the balancing of paths I and Q. It is thus generally preferred to digitize, as soon as possible in the receive chain, the signals to be exploited.

SUMMARY OF THE INVENTION

The present invention aims at decreasing the sampling frequency of an analog-to-digital converter upstream of an amplitude and possibly phase demodulator.

The present invention more specifically aims at decreasing the sampling frequency in applications to electromagnetic transponder systems and especially to systems with remotely-supplied electromagnetic transponders of contactless smart card type or with autonomous terminals.

The present invention also aims at providing a reliable digital amplitude demodulator of simple structure.

To achieve these and other objects, the present invention provides an amplitude demodulator comprising an analog-to-digital converter having its sampling frequency corresponding to three times the frequency of the modulation carrier.

According to an embodiment of the present invention, the demodulator comprises means for calculating amplitude A of a symbol of an input signal applying the following formula:

$$A = k \sqrt{\sum_{i=1}^{3} e_i^2} \ ;$$

where $e_i$ designates the value of a digitized sample of rank i among three successive samples provided by said converter, and where k designates a constant.

According to an embodiment of the present invention, the current sampling frequency is obtained by multiplying by three the current carrier frequency extracted from the input signal or from a reference generator.

The present invention also provides an amplitude and phase demodulator comprising:

amplitude calculation means; and means for calculating the phase of a symbol to be demodulated from the calculated amplitude and the sign of the value of at least one adjacent symbol.

The present invention also relates to a method for demodulating a signal modulated at least in amplitude, comprising:

performing an analog-to-digital conversion of an input signal by applying a sampling frequency equal to three times the frequency of the modulation carrier; and extracting amplitude information A from the following relation:

$$A = k \sqrt{\sum_{i=1}^{3} e_i^2} \ ;$$

where $e_i$ designates the value of a digitized sample of rank i among three successive samples provided by said converter, and where k designates a constant.

According to an embodiment of the present invention, the input signal is modulated in phase and in amplitude, phase information φ being extracted from a current sample by applying the following relation:

φ=Arc cos($e_i$/A).

The present invention also provides an electromagnetic transponder comprising:

an oscillating circuit capable of being excited by a signal at a first relatively high frequency forming the carrier of a second signal modulated at least in amplitude at the rate of a second relatively low frequency; and a demodulator comprising:

an analog-to-digital converter of a signal sampled across the oscillating circuit; and a digital decoder receiving the sampled signal and providing the amplitude of the signal to be demodulated, the sampling frequency corresponding to three times the first frequency.

The present invention also provides a read and/or write terminal of an electromagnetic transponder communication system comprising:

an oscillating circuit capable of being excited by a signal at a first relatively high frequency forming the carrier of a second signal modulated at least in amplitude at the rate of a second relatively low frequency; and a demodulator comprising:

an analog-to-digital converter of a signal sampled across the oscillating circuit; and a digital decoder receiving the sampled signal and providing the amplitude of the signal to be demodulated, the sampling frequency corresponding to three times the first frequency.

The foregoing objects, features, and advantages of the present invention will be discussed in detail in the following non-limiting description of specific embodiments in connection with the accompanying drawings.

DETAILED DESCRIPTION

Figure 1:
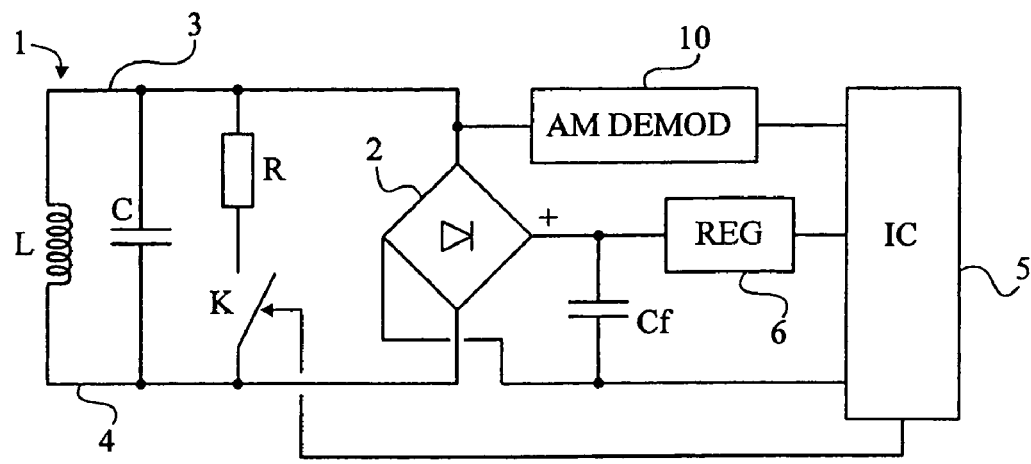
FIG. 1, previously described, shows the architecture of an electromagnetic transponder of the type to which the present invention applies.

The same elements have been designated with the same references in the different drawings. For clarity, only those steps and elements which are necessary to the understanding of the present invention have been shown in the drawings are will be described hereafter. In particular, the numerical calculation circuits have not been detailed, the present invention being implementable with conventional tools. Further, what use is made of the demodulated signals has not been described in detail, since the present invention can be implemented whatever the destination of the demodulated signals, be it a contactless smart card system or more generally any amplitude demodulation system in which the value of the sampling frequency is desired to be reduced or minimized.

A feature of the present invention is to provide a sampling frequency corresponding to three times the carrier frequency of the signal to be modulated.

According to the present invention, instead of a frequency greater than four times the carrier frequency independently from the exact value thereof, a relatively accurate frequency corresponding to three times the carrier frequency is used. The accuracy required for the sampling frequency depends on the modulation index of the signal to be demodulated and on the spectral characteristics of the information signal. For example, in an application to electromagnetic transponders where the modulation index is 10% in a transmission from the reader to the card, an accuracy of +/−1% on the sampling frequency is enough.

Figure 4:
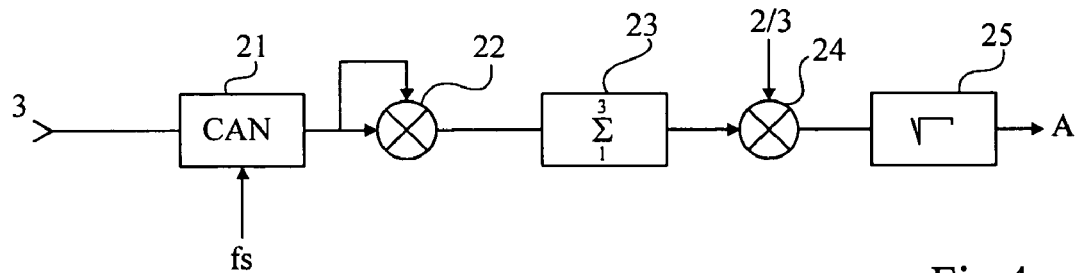
FIG. 4 very schematically shows in the form of blocks an embodiment of a digital demodulator according to the present invention.

FIG. 4 schematically shows in the form of blocks an embodiment of an amplitude demodulator according to the present invention. The signal to be demodulated (for example, coming from an oscillating circuit 1 such as illustrated in FIG. 1) is sent onto an analog-to-digital converter 21 (CAN) having its sampling frequency fs corresponding to three times the frequency of the input signal. The samples provided by converter 21 are squared (multiplier 22, the two inputs of which receive the output signal of converter 21).

The next processing comprises adding up $$\left(\text{block 23,} \sum_{1}^{3}\right)$$

three successive squared samples, then multiplying (multiplier 24) the sum by two thirds (⅔). Finally, the square root (block 25, √) provides the desired amplitude A. This amounts to applying the following formula:

$$A = k\sqrt{\sum_{i=1}^{3} e_i^2};$$

where $e_i$ designates the value of the current sample, that is, the digital value resulting from the conversion. As an alternative, if an information proportional to amplitude A is enough, factor ⅔ may be omitted or replaced with any constant k.

It should be noted that the foregoing description uses an analog terminology for clarity while all the operations performed downstream of converter 21 are performed by means of digital tools.

Figure 5:
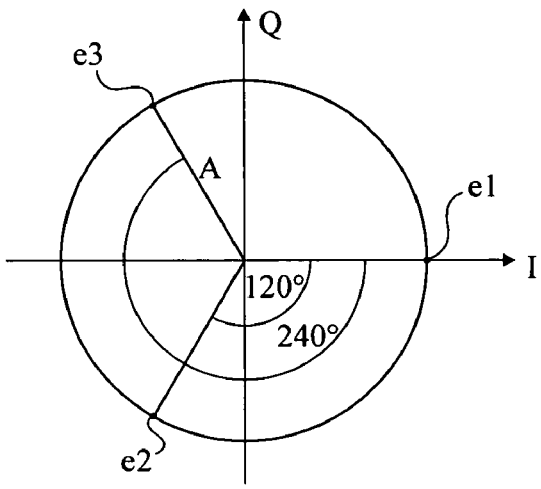
FIG. 5 illustrates the exploitation of the information obtained in a demodulator according to the present invention.

FIG. 5 illustrates the operation of a digital demodulator according to the present invention. This drawing shows a trigonometric circle of radius A on which three samples e1, e2, and e3 of a same symbol to be demodulated, provided by converter 21, have been positioned. Since the sampling frequency corresponds to three times the carrier frequency, the three samples are phase-shifted by 120° with respect to one another. For simplification, sample e1 has been placed with a zero phase shift. It should however be noted that this is of no importance, the important thing being the 120° phase shift between successive samples.

Thus, in the time field, it can be written that the respective numerical values of the samples provided by converter 21 correspond:

for sample e1, to A*cos(ωp.t);

for sample e2, to A*cos(ωp.t+120°); and for sample e3, to A* cos(ωp.t+240°), where ωp designates the carrier pulse.

A value proportional to the square of amplitude A of the modulation can thus be extracted from the three samples (from the sum of the three squared samples). Since the sampling frequency is relatively accurately equal to three times the carrier frequency, this sum is equal to $$\frac{3}{2}A^2.$$

The output of block 26 provides values at the rate of the sampling frequency (synchronously with the carrier). The exploitation of the values depends on the application and on the sub-carrier frequency. For example, a value is selected every n values, n being chosen especially according to the ratio between the sub-carrier and sampling frequencies. Taking the example of a charge modulation ranging between 1 and 10% with the same frequencies as previously, one value every twelve values can be selected, which provides four values per sub-carrier period and is an acceptable compromise to determine the binary values while taking the noise into account.

An advantage of the present invention is that it enables reducing the sampling frequency while obtaining the amplitude whatever the phase at the origin of the carrier signal. Reducing the sampling frequency from a factor 4 to a factor 3 with respect to the carrier frequency is particularly advantageous for high-frequency applications. For example, in the electromagnetic transponder application where the carrier frequency is 13.56 MHz, a reduction by 25% of the sampling frequency allows a 40.68-MHz frequency instead of a frequency of more than 54.24 MHz. For a 27.125-MHz carrier frequency, the sampling frequency falls from a frequency of more than 108.5 MHz to a 81.375-MHz frequency.

Figure 6:
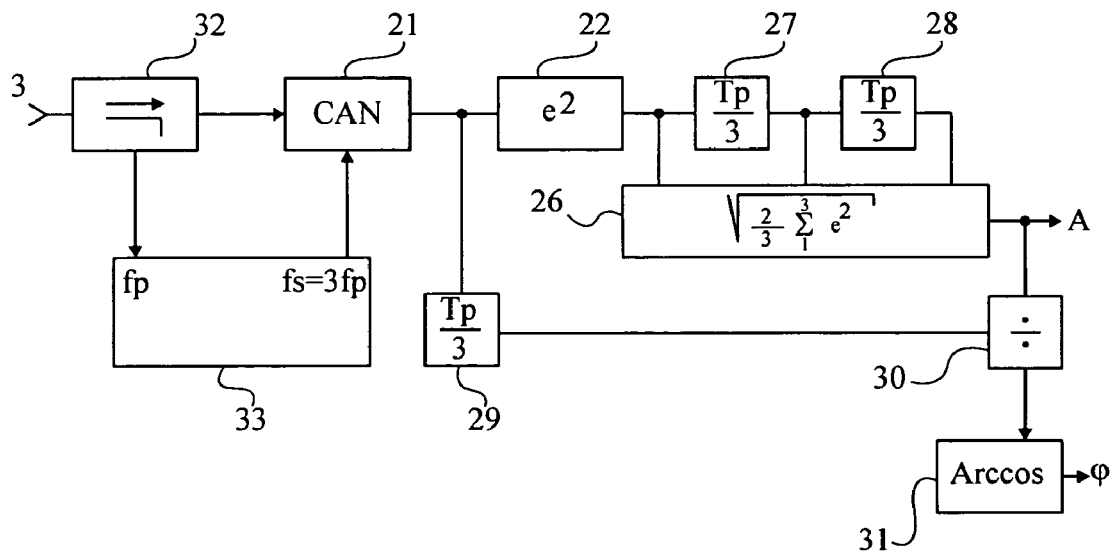
FIG. 6 very schematically shows in the form of blocks an embodiment of an amplitude and phase demodulator according to the present invention.

FIG. 6 shows an embodiment of the present invention in which it is also desired to obtain the phase information of the samples in the context of phase and amplitude modulation of information transmitted to a transponder.

Figure 2:
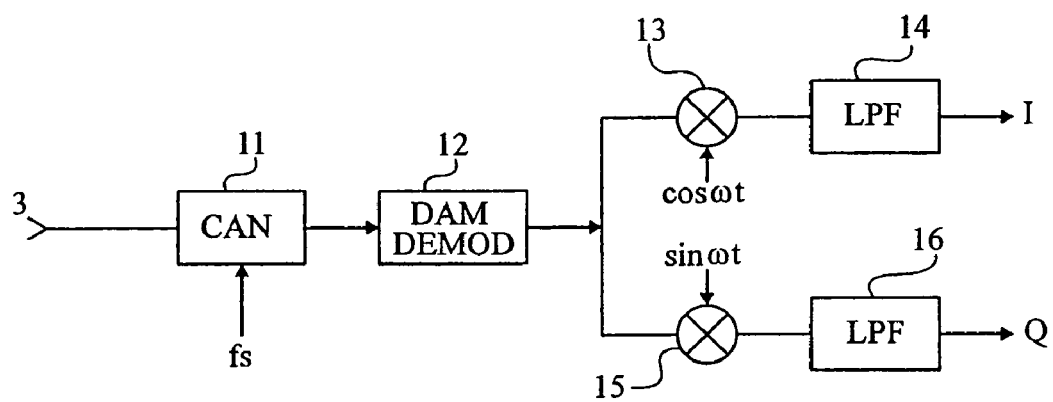
FIG. 2, previously described, shows a conventional example of a digital demodulator applied to modulations with a sub-carrier.
Figure 3:
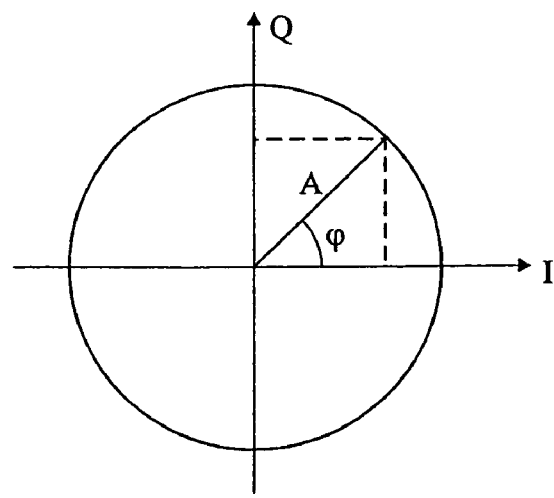
FIG. 3, previously described, illustrates the information obtained by the demodulator of FIG. 2.

Such an embodiment should be compared with that of FIG. 2 where data I and Q provide, from a sampling frequency greater than four times the carrier frequency, the phase and amplitude information.

According to an embodiment of the present invention shown in FIG. 6, sampling frequency fs of the analog-to-digital 21 remains equal to three times the frequency of carrier fp as in FIG. 4. The chain for obtaining amplitude A applies a calculation similar to that of FIG. 4. It starts with a squaring (block 22, $e^2$) of the samples provided by converter 21. Then, the results provided by block 22 are transmitted both directly to a block 26 of calculation of the square root of two thirds of the sum of three successive squared samples $$\left(\sqrt{\frac{2}{3} \cdot \sum_{1}^{3} e^2}\right),$$

and to an element 27 (Tp/3) for delaying by one third the carrier signal period, and thus by the value of sampling period Ts. The output of element 27 is directly sent to block 26 as well as to a second element 28 (Tp/3) for still delaying the carrier period by one third, the output of which is sent to block 26. The successive delays brought to the samples by elements 27 and 28 enable the values present on the three inputs of block 26 to correspond to the three successive squared samples. Block 26 then provides amplitude A.

The phase information is obtained by calculating the arc cosine of a sample divided by its amplitude (sample normalization). To synchronize obtaining the amplitude with the current sample, an element 29 (Tp/3) for delaying by one third the period of the carrier frequency is used before entering a divider 30 which divides the sample by amplitude A. The result of this division is submitted to an arc cosine calculation 31 (Arc cos) which provides phase φ. This calculation amounts to applying the following relation:

$$\phi = \text{Arc cos}(e/A).$$

For this phase determination to be possible, a previous reference must be stored to be able to determine the positive or negative sign of the calculated phase (distinguishing samples e2 and e3 of FIG. 5). For example, the signed value of the previously-calculated phase or the value of at least one adjacent sample (previous and/or next sample) is stored. After, having determined the phase value, its sign can be deduced knowing that each sample is separated from the previous one by a 120° angle. The implementation of such a calculation in digital form is within the abilities of those skilled in the art based on the indications given hereabove.

In the embodiment of FIG. 6, the sampling frequency is obtained by means of a coupler 32 interposed between oscillating circuit 3 and converter 21 to extract carrier frequency fp then submitted to a multiplier (block 33) providing frequency fs. As an alternative, separated clock circuits may be provided. However, an advantage of deducing the sampling frequency from a multiplication of the carrier frequency is that this provides the required accuracy of this sampling frequency. Indeed, and especially in the application to electromagnetic transponders, in case of a drift in the carrier frequency, the sampling frequency follows this drift in real time and is thus controlled by this carrier frequency.

An advantage of the present invention then is that it is particularly easy to obtain an accurate value for the sampling frequency, which guarantees the fulfilling of sampling frequency drift tolerance constraints.

Of course, the present invention is likely to have various alterations, modifications and improvements which will readily occur to those skilled in that art. In particular, although for clarity, the description of the present invention has been made with a vocabulary closer to an architecture of dedicated circuits in wired logic or to an analog technology, all the processings performed downstream of the converter are digital processings that may be performed either by successive circuits in wired logic, or by a processor, the method of the present invention then being implemented in software form. This practical implementation by means of conventional digital tools is within the abilities of those skilled in the art based on the functional indications given hereabove.

Further, the modulation performed at the rate of the relatively low (sub-carrier) frequency with respect to the carrier frequency may comprise modulation of the position, in a multi-level modulation, provided that the carrier is modulated in amplitude.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for demodulating a signal modulated at least in amplitude, comprising:

performing an analog-to-digital conversion of an input signal by applying a sampling frequency equal to three times the frequency of the modulation carrier; and extracting amplitude information A from the following relation:

$$A = k \sqrt{\sum_{i=1}^{3} e_i^2} \ ;$$

where $e_i$ designates the value of a digitized sample of rank i among three successive samples provided by said converter, and where k designates a constant; and wherein the input signal is modulated in phase and in amplitude, phase information φ being extracted from a current sample by applying the following relation:

φ=Arc cos($e_i$/A).

* * * * *

UNITED STATES PATENT AND TRADEMARK OFFICE
CERTIFICATE OF CORRECTION

PATENT NO. : 7,307,472 B2 Page 1 of 1
APPLICATION NO. : 10/974070
DATED : December 11, 2007
INVENTOR(S) : Jean-Pierre Enguent It is certified that error appears in the above-identified patent and that said Letters Patent is hereby corrected as shown below:

Col. 3, line 57 should read:
$\varphi = \text{Arccos}(e_i/A)$

Col. 5, line 25 should read:

$$A = \sqrt{\frac{2}{3} \cdot \sum_{i=1}^{3} e_i^2} \;;$$

Col. 6, line 64 should read:
calculation 31 (Arccos) which provides phase $\varphi$. This
      line 67 should read:
$\varphi = \text{Arccos}(e_i/A)$.

At column 8, line 37 should read:
$\varphi = \text{Arccos}(e_i/A)$.

Signed and Sealed this

Fifteenth Day of April, 2008

JON W. DUDAS
*Director of the United States Patent and Trademark Office*